US010873326B1

(12) United States Patent
Sabde et al.

(10) Patent No.: US 10,873,326 B1
(45) Date of Patent: Dec. 22, 2020

(54) INPUT VOLTAGE SENSING USING ZERO CROSSING DETECTION

(71) Applicant: Eaton Intelligent Power Limited, Dublin (IE)

(72) Inventors: Swapnil Sabde, Thane West (IN); Gayatri Vinod Pandit, Pune (IN); Vinay M. Patil, Pune (IN); Saivaraprasad Murahari, Peachtree City, GA (US); Hoon Lee, Sugar Hill, GA (US)

(73) Assignee: Eaton Intelligent Power Limited, Dublin 4 (IE)

( * ) Notice: Subject to any disclaimer, the term of this patent is extended or adjusted under 35 U.S.C. 154(b) by 0 days.

(21) Appl. No.: 16/594,658

(22) Filed: Oct. 7, 2019

(51) Int. Cl.
*H03K 5/1536* (2006.01)
*G06G 7/14* (2006.01)
*G01R 19/175* (2006.01)
*H05B 47/185* (2020.01)

(52) U.S. Cl.
CPC .......... *H03K 5/1536* (2013.01); *G01R 19/175* (2013.01); *G06G 7/14* (2013.01); *H05B 47/185* (2020.01)

(58) Field of Classification Search
CPC ...... H05B 45/10; H05B 45/37; H05B 47/185; Y02B 70/126; H02M 2001/0009; H02M 3/33507; H03K 5/1536; G06G 7/14; G01R 19/175
See application file for complete search history.

(56) References Cited

U.S. PATENT DOCUMENTS

| | | |
|---|---|---|
| 5,424,709 A | 6/1995 | Tal |
| 6,593,538 B2 | 7/2003 | Perret et al. |
| 7,190,936 B1 | 3/2007 | Teo et al. |
| 9,026,648 B1 | 5/2015 | Slavin |
| 9,413,171 B2 | 8/2016 | Neyhart |
| 9,847,912 B1 | 12/2017 | Hutz et al. |
| 9,860,965 B2 | 1/2018 | Recker et al. |
| 9,881,493 B2 | 1/2018 | Kim et al. |
| 10,141,739 B1 | 11/2018 | Davis et al. |
| 10,164,541 B2 | 12/2018 | Onodera et al. |

(Continued)

OTHER PUBLICATIONS

Automated 3-way Switches: What should my wiring look like? (US version)—wiki—SmartThings Community, downloaded from internet Feb. 24, 2018, https://community.smartthings.com/t/automated-3-way-switches-what-should-my-wiring-look-like-us-version/19075.

*Primary Examiner* — Sibn Chen
(74) *Attorney, Agent, or Firm* — Fox Rothschild LLP

(57) ABSTRACT

Systems and methods are provided for measuring input voltage in an alternating current (AC) system is provided. The method includes measuring a half-cycle time of an AC signal by: detecting, using a zero crossing detector (ZCD), a first edge of the AC signal; in response to detecting the first edge, using a timer to determine a start time; detecting, using the microcontroller, a subsequent edge of the square wave output of ZCD signal; and, in response to detecting the subsequent edge, using the timer to determine a stop time and a length of time that lapsed from the start and stop times. The method further includes determining an overall value that corresponds to at least one length of time, determining, based on the overall value, an input voltage range that corresponds to the overall value, and using the input voltage to cause the AC system to take an action.

16 Claims, 6 Drawing Sheets

(56) References Cited

U.S. PATENT DOCUMENTS

| | | | |
|---|---|---|---|
| 10,564,226 B2 | 2/2020 | Katrak et al. | |
| 2005/0275983 A1 | 12/2005 | Franklin et al. | |
| 2013/0038318 A1* | 2/2013 | Inukai | G01R 19/18 |
| | | | 324/120 |
| 2014/0009270 A1 | 1/2014 | Yamazaki | |
| 2014/0175875 A1 | 6/2014 | Newman, Jr. et al. | |
| 2015/0143150 A1 | 5/2015 | Verdun | |
| 2016/0107589 A1* | 4/2016 | Proebstle | B60K 6/28 |
| | | | 307/10.1 |
| 2016/0322831 A1 | 11/2016 | Gilbert et al. | |
| 2017/0019098 A1 | 1/2017 | Kang et al. | |
| 2017/0027079 A1 | 1/2017 | Dombrowski et al. | |
| 2017/0045249 A1 | 2/2017 | Lee et al. | |
| 2017/0068267 A1 | 3/2017 | El-Gayyar | |
| 2017/0069449 A1 | 3/2017 | El-Gayyar | |
| 2017/0271904 A1 | 9/2017 | Ziv | |
| 2018/0052008 A1 | 2/2018 | Maman et al. | |
| 2018/0056902 A1 | 3/2018 | Trinkner et al. | |
| 2018/0062534 A1 | 3/2018 | Xiong et al. | |
| 2018/0083610 A1 | 3/2018 | Ishii et al. | |
| 2018/0103211 A1 | 4/2018 | Marino et al. | |
| 2018/0116039 A1 | 4/2018 | Harte et al. | |
| 2019/0281642 A1 | 9/2019 | Su et al. | |
| 2019/0289243 A1 | 9/2019 | Pretlow et al. | |

* cited by examiner

INPUT VOLTAGE SENSING USING ZERO CROSSING DETECTION

BACKGROUND

The present disclosure relates to voltage sensing and, in particular, to systems and methods for sensing input voltages using zero crossing detection circuits, such as those that may be used in electronic devices such as dimmers and circuit breakers.

Electronically powered devices are a staple of the modern world, with countless types of devices needing to be plugged into a power source at one time or another. However, not every device can have same input voltage. Similarly, not every power source provides the stable input voltage to the electronic device. The input voltage may fluctuate over a specific range.

Because of these various factors in powering an electronic device, it is beneficial to perform voltage sensing in order to determine an input voltage being supplied. Input voltages may be used for diagnostic and calibration purposes. Typically, a multitude of hardware and/or accompanying software is required in order to determine input voltage ranges. This hardware increases the costs required to determine input voltages.

For at least these reasons, improved systems and methods for efficiently determining input voltages are needed in cases where systems are compatible to work for more than one voltage or multiple input voltage systems.

This document describes devices and systems that are intended to address the problems described above, and/or other problems.

SUMMARY

According to an aspect of the present disclosure, a method of measuring input voltage in an alternating current (AC) system is provided. The method includes measuring a half-cycle time of an AC signal by using a zero-crossing detector (ZCD) to detect a first edge, being a rising or falling edge, of the AC signal. In response to detecting the first edge, the method may include using a timer to determine a start time. The method may include detecting, using the ZCD, a second edge of the AC signal, the second edge being a subsequent rising or falling edge. In response to detecting the second edge, the method may include using the timer to determine a stop time and a length of time that lapsed from the start time and the stop time. The method further includes determining an overall value that corresponds to at least one length of time. The method also includes, determining, based on the overall value, an input voltage range that corresponds to the overall value, and using the input voltage to cause the AC system to take an action.

In some embodiments, the method further includes repeating the measuring to determine multiple lengths of time. In some embodiments, the at least one length of time includes the determined multiple lengths of time.

In some embodiments, determining the overall value further includes one or more of the following: determining an average of the multiple lengths of time; determining a mean of the multiple lengths of time; filtering highest values from the multiple lengths of time; or filtering lowest values from the multiple lengths of time.

In some embodiments, determining the input voltage comprises, if the value is within a first threshold range, determining that the input voltage is approximately 120 VAC. In some embodiments, if the value is within a second threshold range, determining that the input voltage is approximately 277 VAC, and, if the value is within a third threshold range, determining that the input voltage is approximately 347 VAC.

In some embodiments, the first threshold range is from 8.78 msec to 8.88 msec, wherein the second threshold range is from 8.66 msec to 8.74 msec, and wherein the third threshold range is from 8.58 msec to 8.63 msec. These values may vary depending on the selected component and its tolerances.

In some embodiments, determining the input voltage is performed using a microcontroller coupled to the ZCD or ZCD inbuilt to the microcontroller.

In some embodiments, if no input voltage range corresponds to the overall value, the system will determine if the overall value is greater than an overall value threshold.

In some embodiments, if the overall value is greater than the overall value threshold, the system may generate an error value.

In some embodiments, if the error value is greater than an error value threshold, the system may turn off a load.

According to another aspect of the present disclosure, a system of measuring input voltage in an AC system is provided. The system includes a voltage sensing module. The voltage sensing module may include a zero-crossing detector (ZCD) circuit and a microcontroller, housing firmware, including a timer. The ZCD circuit may be configured to convert an input voltage signal from the AC system into a square waveform. The firmware may be configured to measure the input voltage corresponding to a time duration of the ZCD waveform. The microcontroller may be configured to measure a half-cycle time of the input voltage signal. The microcontroller may be configured to determine a start time in response to detecting a first edge of the square waveform, the first edge being a rising or falling edge. The microcontroller may be configured to determine an end time in response to detecting a next edge of the square waveform, the next edge being a subsequent rising or falling edge. An overall value of the length of time that elapsed from the start time to the end time may be determined. The microcontroller may be configured to determine an input voltage range that corresponds to the overall value. The microcontroller may use the input voltage to cause the AC system to take an action.

In some embodiments, the microcontroller is configured to measure multiple lengths of time. In some embodiments, the at least one length of time includes the measured multiple lengths of time.

In some embodiments, the determining the overall value further includes one or more of the following: determining an average of the multiple lengths of time; determining a mean of the multiple lengths of time; filtering highest values from the multiple lengths of time; or filtering lowest values from the multiple lengths of time.

In some embodiments, the determining the input voltage comprises, if the value is within a first threshold range, determining that the input voltage is approximately 120 VAC, if the value is within a second threshold range, determining that the input voltage is approximately 277 VAC, and, if the value is within a third threshold range, determining that the input voltage is approximately 347 VAC.

In some embodiments, the first threshold range is from 8.78 msec to 8.88 msec, wherein the second threshold range is from 8.66 msec to 8.74 msec, and wherein the third threshold range is from 8.58 msec to 8.63 msec. These values may vary depending on the selected component and its tolerances.

In some embodiments, the microcontroller is coupled to the ZCD circuit.

In some embodiments, the microcontroller is further configured to, if no input voltage range corresponds to the overall value, determine if the overall value is greater than an overall value threshold.

It is an object of the present invention to provide the system of measuring input voltage in an AC system, wherein the microcontroller is further configured to, if the overall value is greater than the overall value threshold, generate an error value.

It is an object of the present invention to provide the system of measuring input voltage in an AC system, wherein the microcontroller is further configured to, if the error value is greater than an error value threshold, turn off a load.

DETAILED DESCRIPTION

As used in this document, the singular forms "a," "an," and "the" include plural references unless the context clearly dictates otherwise. Unless defined otherwise, all technical and scientific terms used herein have the same meanings as commonly understood by one of ordinary skill in the art. When used in this document, the term "comprising" (or "comprises") means "including (or includes), but not limited to." When used in this document, the term "exemplary" is intended to mean "by way of example" and is not intended to indicate that a particular exemplary item is preferred or required.

In this document, when terms such "first" and "second" are used to modify a noun, such use is simply intended to distinguish one item from another, and is not intended to require a sequential order unless specifically stated. The term "approximately," when used in connection with a numeric value, is intended to include values that are close to, but not exactly, the number. For example, in some embodiments, the term "approximately" may include values that are within +/−10 percent of the value.

Other terms that are relevant to this disclosure are defined at the end of this Detailed Description section.

Figure 1:
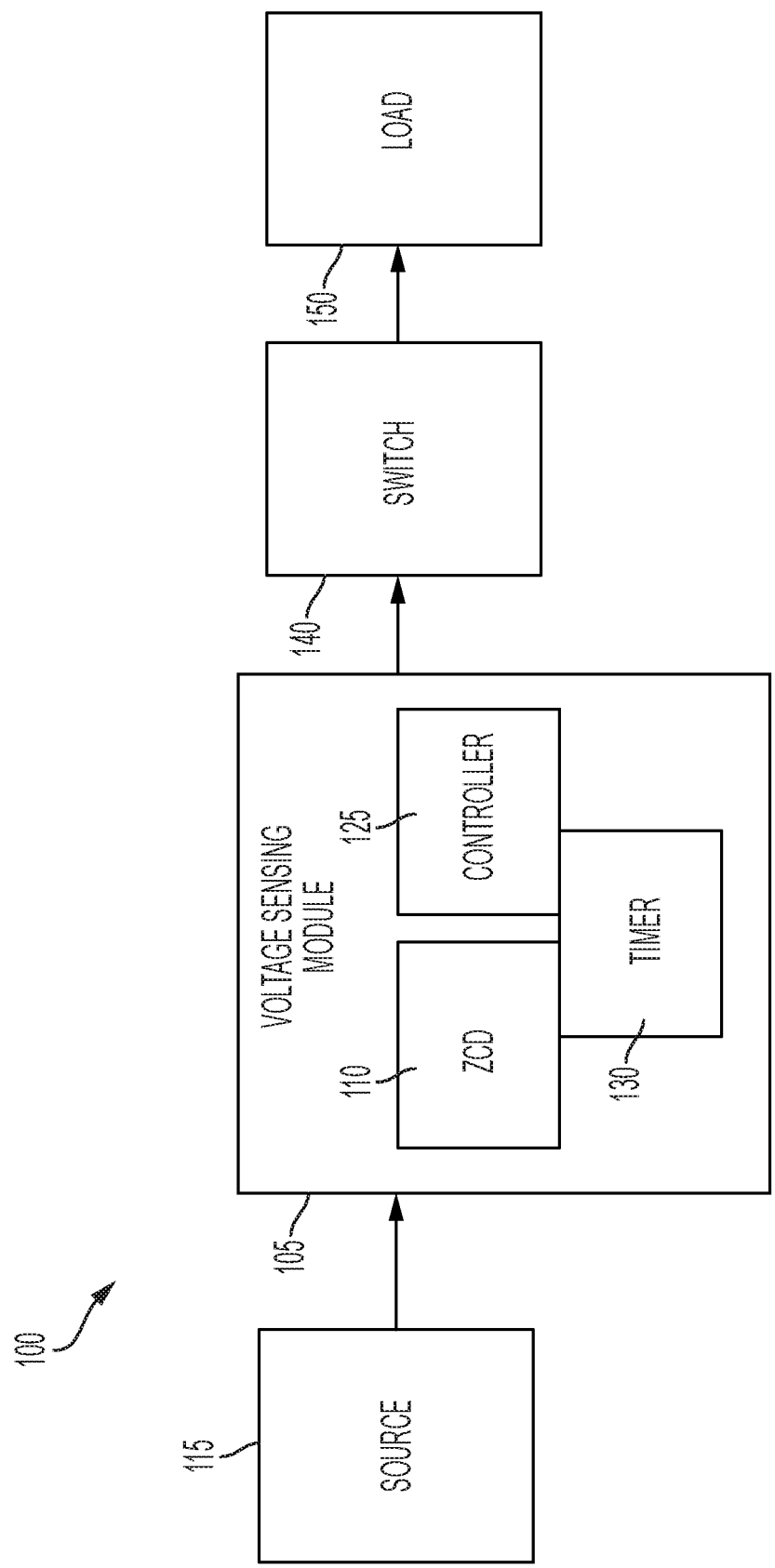
FIG. 1 is an example of a system for measuring input voltage in an alternating current (AC) system, in accordance with the present disclosure.

Referring now to FIG. 1, a system 100 for delivering power from an alternating current (AC) source 115 to a load 150 is illustratively depicted in accordance with various embodiments.

Figure 6:
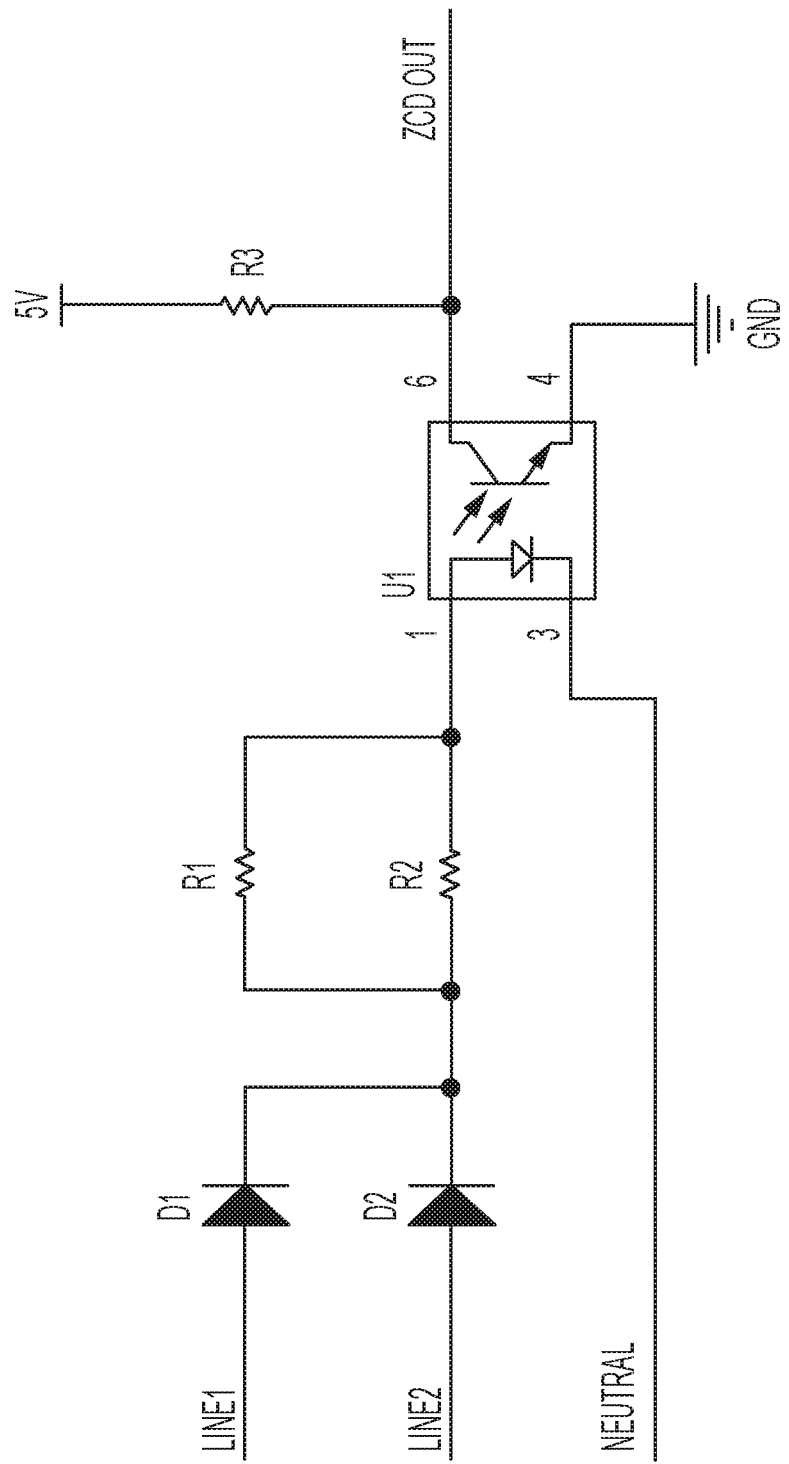
FIG. 6 shows an example of an electrical schematic of a zero-crossing detector (ZCD) circuit, in accordance with an embodiment of the present invention.

According to various embodiments, the system 100 includes a voltage sensing module 105. The voltage sensing module 105 may include a zero-crossing detection (ZCD) circuit 110. According to an embodiment, the voltage sensing module 105 may be a component of a switching of device such as a circuit breaker, a dimmer, or other electronic switching device. Alternatively, the voltage sensing module may be electrically connected between the source and a switch 140 such a circuit breaker or another switching circuit such as a TRIAC, silicon-controlled rectifier (SCR) or field effect transistor (FET). According to an embodiment, the ZCD circuit 110 is used to synchronize a device with an input AC line voltage and generate a required drive output for the load 150 with the help of a microcontroller 125. An example of an electrical schematic for a ZCD circuit 110 which may be used in conjunction with system 100 is shown in FIG. 6.

According to various embodiments, the voltage sensing module 105 and, in particular, the ZCD circuit 110 is coupled to an AC input voltage source 115 (e.g., a power outlet). The input voltage from the AC input voltage source 115 produces an input sine wave. The ZCD circuit 110 is configured to convert the input sine wave into a square waveform, producing rising edges in the square waveform and falling edges in the square waveform. The ZCD circuit 110 may incorporate an optocoupler or a transistor circuit.

The voltage sensing module 105 may further include a controller 125 such as a microcontroller configured to store embedded firmware which, in turn, is configured to analyze the square waveform generated by the ZCD circuit 110 and identify the input voltage range. Other programmable controllers may be used, such as microprocessors, a programmable system on a chip (PSoC), field programmable gate array (FGPA), or other programmable logic device. The ZCD circuit 110 is in electronic communication with the microcontroller 125. According to an embodiment, the microcontroller 125 may further be programmed to include, or the voltage sensing module 105 may otherwise include, one or more timers 130 configured to record a length of time measured from a measured rising or falling edge of the input voltage to a subsequent measured rising or falling edge of the input voltage.

The present system 100 performs voltage sensing using the ZCD circuit 110 in conjunction with firmware logic executed using the controller 125, avoiding any extra hardware typically required to perform voltage sensing. The present system 100 and method 200 can be used in any products where a TRIAC/SCR/FET and/or any switching device 140 is used to fire a solenoid (e.g., a dimmer, AFCI, AFGF, etc.). The simplicity and compact nature of the present disclosure further enables the voltage sensing module 105 to be configured for use in multiple markets such as, e.g., in various residential, commercial, and/or commercial supply voltage ranges. Furthermore, since the voltage sensing module 105 performs voltage sensing using the same input signal that was received from the AC input voltage source 115, no extra voltage sensing circuitry and/or input/output pins within the controller 125 are required, thus improving upon the existing technologies, although the present disclosure is not limited to embodiments that exclude such circuitry or pins.

Figure 2:
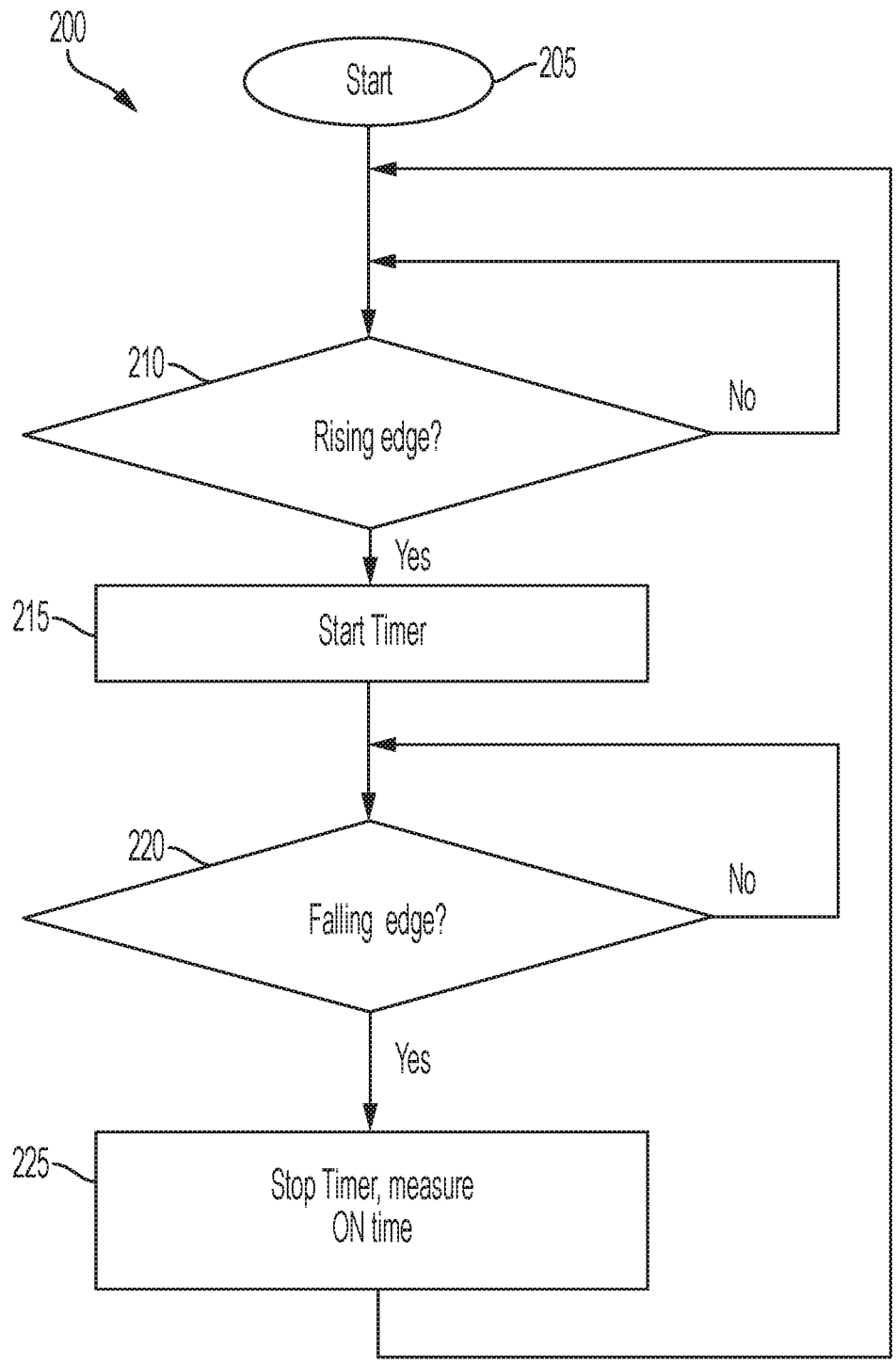
FIG. 2 is a flowchart of an example of a method for measuring a length of time from a first edge to a subsequent edge from an input voltage in an AC system, in accordance with the present disclosure.

Referring now to FIG. 2, a flowchart of a method 200 for measuring a length of time from a first edge to a subsequent or next edge from an input voltage in an AC system is illustratively depicted in accordance with an embodiment of the present disclosure.

According to an embodiment, at 205, a ZCD circuit begins measuring a supply voltage. The ZCD circuit is used to synchronize a device with input AC line voltage and generate required drive output with the help of a controller. According to an embodiment, the ZCD circuit provides a square waveform output that switches from 0 to 5V from the AC sinewave input, which goes as input to the controller. According to an embodiment, this signal can be used to measure the peak voltage of the input supply voltage.

According to an embodiment, the controller, using its firmware or other program instructions, analyzes the supply voltage, at 210, to determine whether a rising or falling edge in the AC current of the supply voltage is detected. If no rising or falling edge in the AC current is detected, the ZCD circuit continues to measure the supply voltage until it detects a rising or falling edge. When a rising or falling edge in the AC current is detected, then, at 215, a start timer measures a start time of the rising or falling edge.

According to an embodiment, after the start timer measures the start time of the first edge, the ZCD circuit, at 220, waits for the next subsequent edge in the AC current of the supply voltage. If the first edge is a rising edge, the next edge will be a falling edge, and vice versa. If no next edge in the AC current is detected, the ZCD circuit continues to measure the supply voltage until the next rising or falling edge is detected. When the next or second edge in the AC current is detected, then, at 225, a stop timer measures an end time of the second edge, enabling a length of time from the start time to the end time to be calculated. According to an embodiment, following the stop timer, the system repeats the process, calculating multiple lengths of time between start times and end times. Note that the "start timer" and "stop timer" need not necessarily be separate components, but simply may represent start functions and stop functions of a single timing device.

According to an embodiment, a half-cycle time of an AC signal is measured. According to various embodiments, the measurement is performed using the microcontroller coupled to the ZCD circuit. The ZCD circuit converts the sinewave of the input voltage into a square waveform and the microcontroller analyzes an "ON" time of the square waveform by detecting a rising or falling edge. In response to detecting the first edge, a timer is used to determine the ON time. According to an embodiment, the microcontroller starts the timer at the first edge of the ZCD waveform. The first edge may be a rising or falling edge of the square waveform. In response to detecting the next edge of the square waveform, the timer is used to determine an end time. The next edge may be a subsequent rising or falling edge of the square waveform. This start time and end time are used to determine a length of time that has lapsed from the first edge and the next edge. According to an embodiment, multiple lengths of time are measured, wherein each length of time correlates to a time lapse from a start time to an end time. According to an embodiment, a length of time is measured for one or more voltage cycles.

According to an embodiment, if multiple lengths of time are measured, an average of the multiple measured lengths of time is determined. According to various embodiments, the average of the multiple lengths of time may be determined by calculating an average of the multiple lengths of time, by calculating a mean of the multiple lengths of time, by filtering out the highest values from the multiple lengths of time, by filtering out the lowest values from the multiple lengths of time, and/or any other suitable means of calculating the average of the multiple lengths of time.

According to an embodiment, the duration of each of the lengths of time is dependent from the tolerance levels of the ZCD circuit. Therefore, a length of time may increase if the ZCD circuit is calibrated with low tolerance levels and the length of time may decrease if the ZCD circuit is calibrated with low tolerance levels.

The length of time is directly proportional to a peak value of a voltage. Using this correlation, the present system calculates an overall value that corresponds to at least one length of time and possibly an average of multiple lengths of time. According to an embodiment, based on this overall value, an input voltage is determined that corresponds to the overall value. Once the input voltage is determined, the system may perform an action based on this determined input voltage, such as opening a switch and interrupting delivery of power to a load if the input voltage is above an upper threshold or below a lower threshold.

Figure 3:
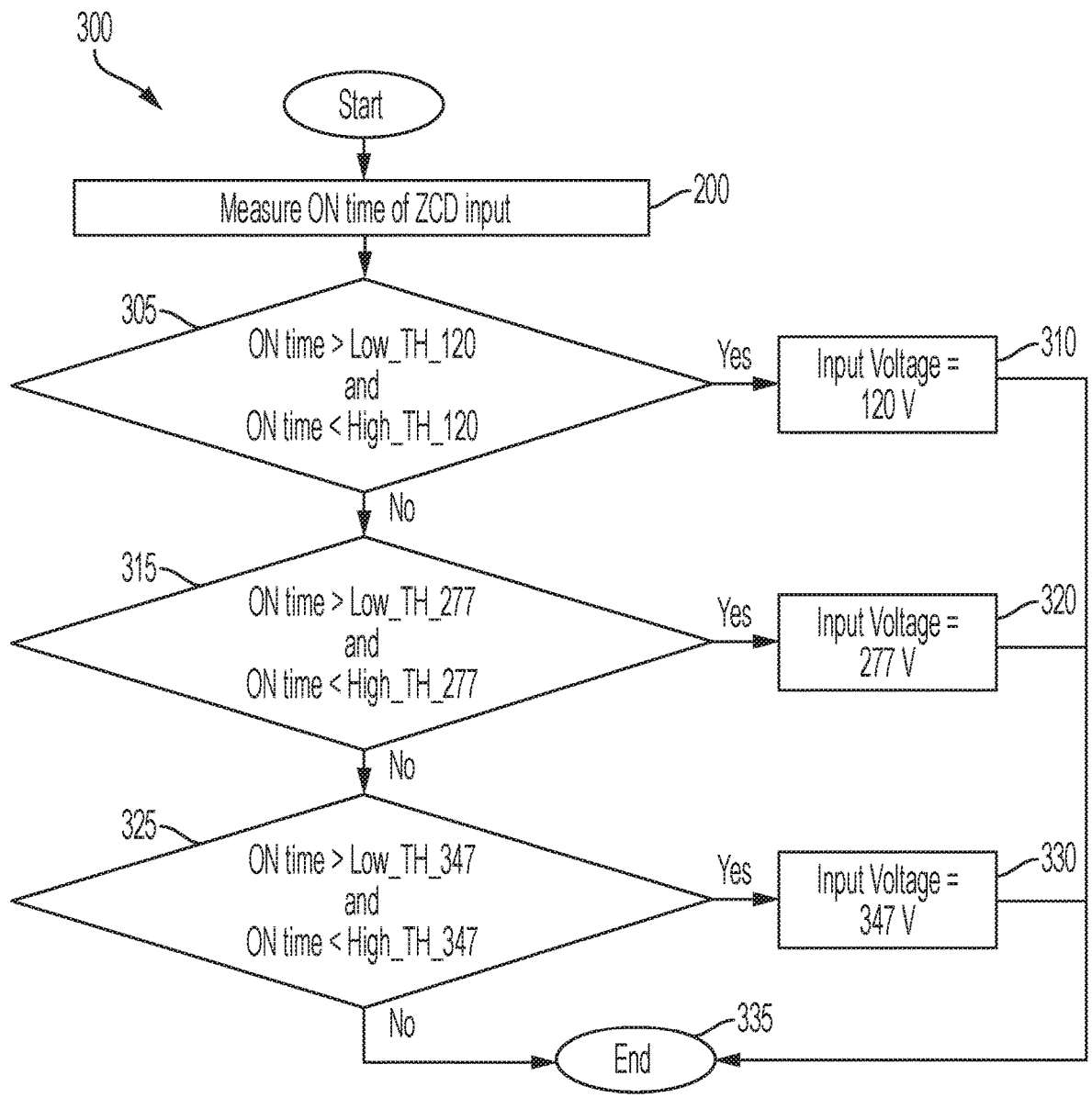
FIG. 3 is a flowchart of an example of a method for measuring input voltage in an AC system for different voltage ranges, in accordance with the present disclosure.

Referring now to FIG. 3, a flowchart of a method 300 for measuring input voltage in an AC system for different voltage ranges is illustratively depicted in accordance with an embodiment of the present disclosure.

The range of AC input may be 120 VAC, 277 VAC, or 347 VAC. Each voltage level has an acceptable range of fluctuation of +/−10%, on average. As a result, devices running on AC power must account for these ranges and be adaptable to input range fluctuations without affecting output.

According to an embodiment, if the value of the overall value is within a first threshold range, the input voltage is determined to be approximately 120 VAC. According to an embodiment, the first threshold range may be from approximately 8.78 msec to 8.88 msec. It is noted, however, that the threshold may be dependent upon electronics component tolerances used in the ZCD circuit.

According to an embodiment, if the value of the overall value is within a second threshold range, the input voltage is determined to be approximately 277 VAC. The second threshold range may be from approximately 8.66 msec to 8.74 msec. It is noted, however, that the threshold may be dependent upon electronics component tolerances used in the ZCD circuit.

According to an embodiment, if the value of the overall value is within a third threshold range, the input voltage is determined to be approximately 347 VAC. The third threshold range may be from approximately 8.58 msec to 8.63 msec.

Figure 5:
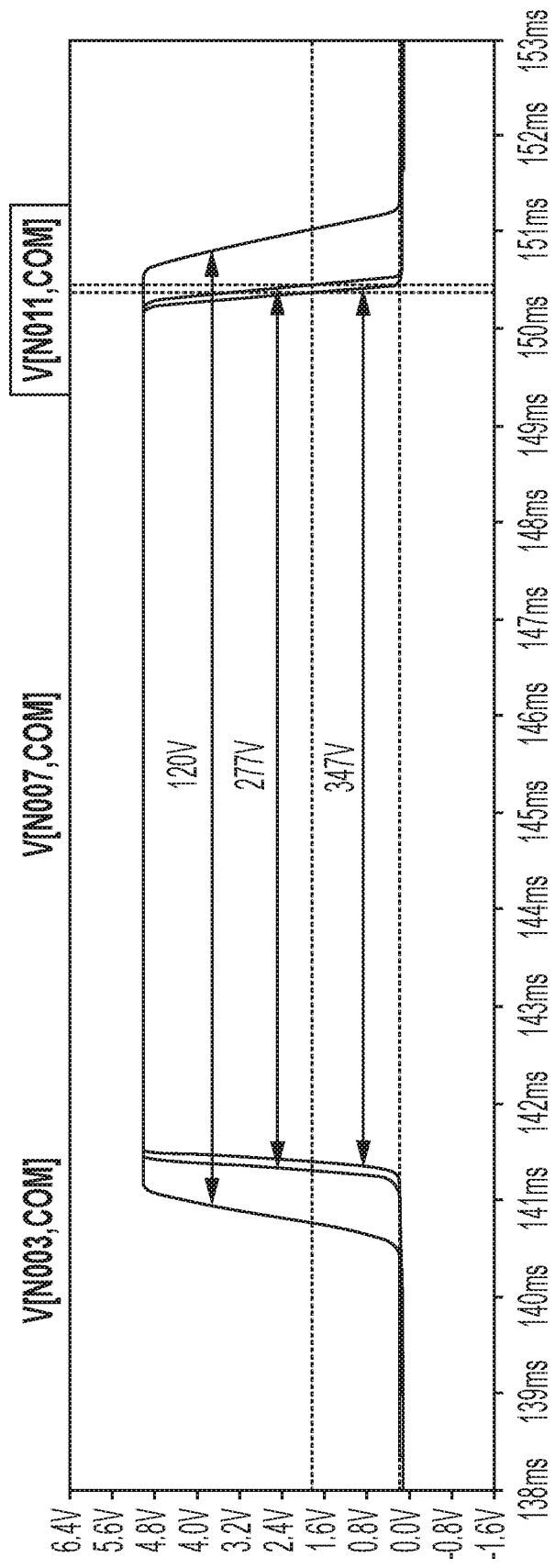
FIG. 5 shows an example of a square waveform indicating examples of rising edge slopes and falling edge slopes for input voltage ranges, in accordance with various embodiments of the present invention.

As shown in the square waveform of FIG. 5, each of the approximate VAC ranges (120 VAC, 277 VAC, and 347 VAC) has an approximate slope for the first edge and the next edge. This slope is calculated and detected from the ZCD to determine the points of time in which the on time and the off time are calculated.

According to an embodiment, at 200, the length of time (also referred to as the "on time"), or average of multiple lengths of time, is calculated.

According to an embodiment, at 305, the on time, calculated from one length of time or the average of a plurality of lengths of time, is compared against the threshold for the 120 VAC voltage level. If the on time is greater than a low threshold for the 120 VAC voltage level and less than the high threshold for the 120 VAC voltage level, than, at 310, the voltage level is determined to be, and labeled as, 120 V and the process ends, at 335.

According to an embodiment, at 315, the on time, calculated from one length of time or the average of a plurality of lengths of time, is compared against the threshold for the 277 VAC voltage level. If the on time is greater than a low threshold for the 277 VAC voltage level and less than the high threshold for the 277 VAC voltage level, than, at 320, the voltage level is determined to be, and labeled as, 277 V and the process ends, at 335.

According to an embodiment, at 325, the on time, calculated from one length of time or the average of a plurality of lengths of time, is compared against the threshold for the 347 VAC voltage level. If the on time is greater than a low threshold for the 347 VAC voltage level and less than the high threshold for the 347 VAC voltage level, than, at 330, the voltage level is determined to be, and labeled as, 120 V and the process ends, at 335, with no voltage level having been determined.

Input voltages may be used for diagnostic and calibration purposes. Typically, a multitude of hardware and/or accompanying software is required in order to determine input voltage ranges. This hardware increases the costs required to determine input voltages. The system and method of the present disclosure, however, is configured to sense and determine input voltages without the need for excessive circuitry, and thereby may help to reduce the cost and space needed for determining input voltages and improve upon the existing technology.

Figure 4:
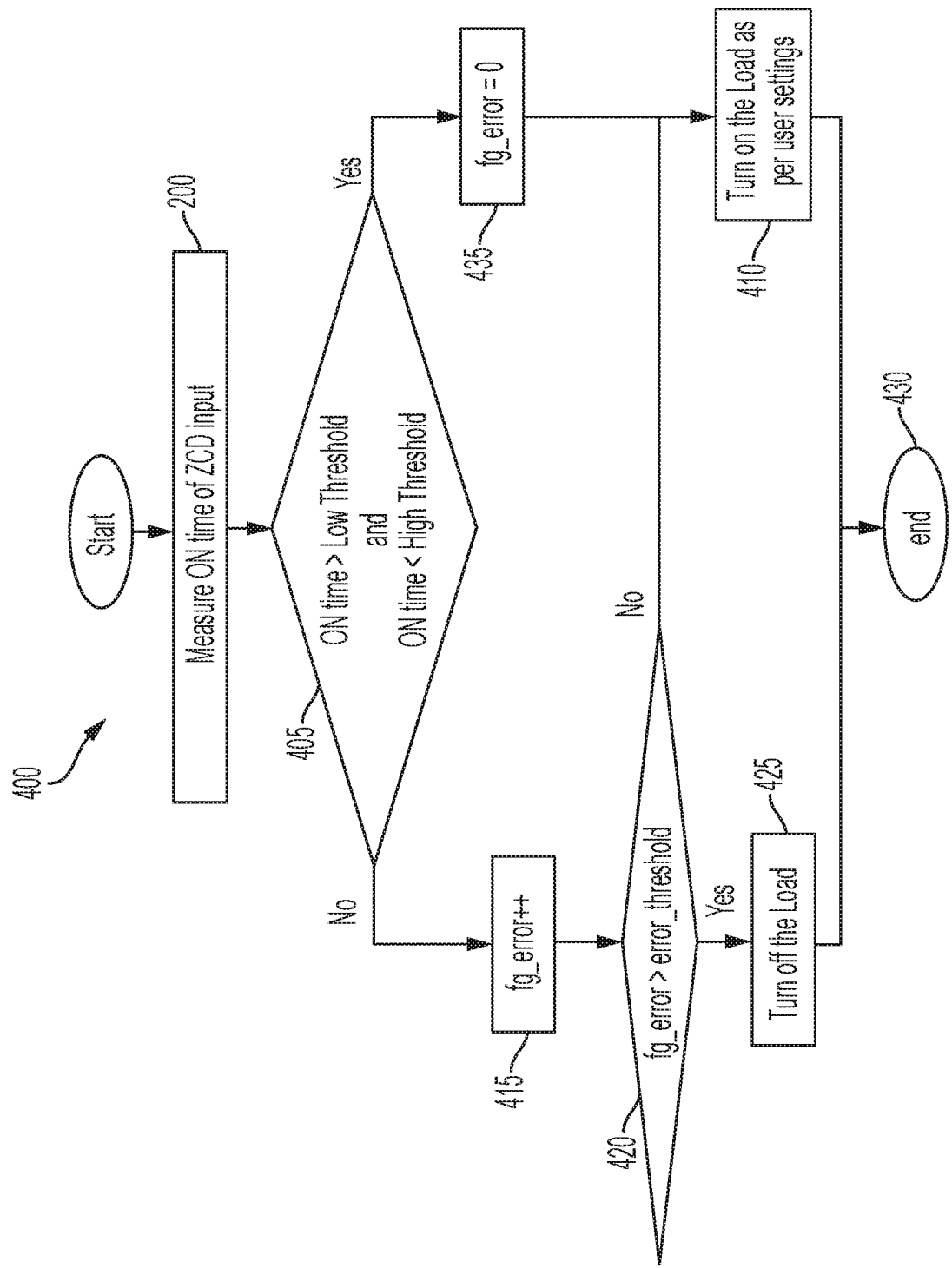
FIG. 4 is a flowchart of an example of a method for detecting input voltage that is out of a threshold range, in accordance with various embodiments.

Referring now to FIG. 4, a flowchart of a method 400 for detecting input voltage that is out of a determined range is illustratively depicted in accordance with an embodiment of the present disclosure.

According to an embodiment, at 200, the length of time (also referred to as the "on time"), or average of multiple lengths of time, is calculated for an input voltage.

According to an embodiment, the system determines, at 405, whether the on time is above a minimum (lower) threshold and below a maximum (upper) threshold. The thresholds may be predetermined (e.g., programmed into the controller's programming instructions), established based on an external input, or calculated based on one or more rule sets using one or more other parameters (such as ambient temperature). In various embodiments, the thresholds may not be predetermined. If the on time is determined to be in the range from the minimum threshold to maximum threshold, no error is reported and the load is turned on, at 410, per the determined voltage range level (as determined in FIG. 3), and the process ends, at 430. According to an embodiment, at 435, if an error is equal to 0, then the load is turned on, at 410, per the determined voltage range level (as determined in FIG. 3), and the process ends, at 430.

If the on time is not determined to be in the range from the minimum threshold to maximum threshold, then an error is signaled and/or recorded, at 415. Once an error is established, it is determined, at 420, whether the error is greater than an error threshold. If the error is not greater than the error threshold, then the load is turned on, at 410, per the determined voltage range level (as determined in FIG. 3), and the process ends, at 430. According to an embodiment, if the error is greater than the error threshold, then, at 425, the load is turned off, and the process ends, at 430.

According to various embodiments, the load is kept "ON" when the error range exceeds the bounds of the threshold error level. The zero-crossing signal may be continuously monitored, and the load may be turned "ON" to the latest user input level when the ON time range is back within the threshold.

In this document, the term "controller" refers to a device or system that includes a processor or other circuitry that can implement programming instructions. A controller may have a processor and memory, as with a microcontroller. Each controller may have its own processor or memory, or the processor and/or memory may be shared with other devices as in a virtual machine or container arrangement. The memory will contain or receive programming instructions that, when executed by the processor, cause the electronic device to perform one or more operations according to the programming instructions.

In this document, "electronic communication" refers to the transmission of data via one or more signals between two or more electronic devices, whether through a wired or wireless network, and whether directly or indirectly via one or more intermediary devices. Devices are "communicatively connected" if the devices are able to send and/or receive data via electronic communication.

The features and functions described above, as well as alternatives, may be combined into many other different systems or applications. Various alternatives, modifications, variations or improvements may be made by those skilled in the art, each of which is also intended to be encompassed by the disclosed embodiments.

The invention claimed is:

1. A method of measuring input voltage in an alternating current (AC) system, the method comprising:
   measuring a half-cycle time of an AC signal by:
     detecting, using a zero-crossing detector (ZCD), a first edge of the AC signal, wherein the first edge is either a rising edge or a falling edge;
     in response to detecting the first edge, using a timer to determine a start time;
     detecting, using the ZCD, a second edge of the AC signal, wherein the second edge is an opposite of the first edge; and
     in response to detecting the second edge, using the timer to determine a stop time and a length of time that lapsed from the start time to the stop time;
   repeating the measuring to determine multiple lengths of time;
   determining an overall value that corresponds to at least one length of time,
   wherein the determining includes one or more of the following:
     determining an average of the multiple lengths of time;
     determining a mean of the multiple lengths of time;
     filtering highest values from the multiple lengths of time; or
     filtering lowest values from the multiple lengths of time;
   based on the overall value, determining an input voltage range that corresponds to the overall value; and
   using the input voltage to cause the AC system to take an action.

2. The method as recited in claim 1, wherein the at least one length of time includes the determined multiple lengths of time.

3. The method as recited in claim 1, wherein determining the input voltage comprises:
   if the value is within a first threshold range, determining that the input voltage is approximately 120 VAC;
   if the value is within a second threshold range, determining that the input voltage is approximately 277 VAC; and
   if the value is within a third threshold range, determining that the input voltage is approximately 347 VAC.

4. The method as recited in claim 3,
   wherein the first threshold range is from 8.78 msec to 8.88 msec, wherein the second threshold range is from 8.66 msec to 8.74 msec, and wherein the third threshold range is from 8.58 msec to 8.63 msec.

5. The method as recited in claim 1, wherein determining the input voltage is performed using a microcontroller coupled to the ZCD.

6. The method as recited in claim 1, further comprising:
if no input voltage range corresponds to the overall value, determining if the overall value is greater than an overall value threshold.

7. The method as recited in claim 6, further comprising:
if the overall value is greater than the threshold, generating an error value.

8. The method as recited in claim 7, further comprising:
if the error value is greater than an error value threshold, interrupting the delivery of power to a load.

9. A system of measuring input voltage in an alternating current (AC) system, the system comprising:
a voltage sensing module, including:
a zero-crossing detector (ZCD) circuit; and
a controller including:
a start timer; and
an end timer,
wherein the ZCD circuit is configured to convert an input voltage signal from the AC system into a square waveform,
wherein the controller is programmed to measure the input voltage signal,
wherein the controller is configured to measure multiple lengths of time, and
wherein the controller is configured to measure a half-cycle time of the input voltage signal by:
detecting a first edge of the square waveform,
wherein the first edge is either a rising edge or a falling edge;
in response to detecting the first edge, using the start timer to determine a start time;
detecting a second edge of the square waveform,
wherein the second edge is an opposite of the first edge;
in response to detecting the second edge, using the end timer to determine a stop time and a length of time that lapsed from the start time to the stop time;
determining an overall value that corresponds to at least one length of time, the determining including one or more of the following:
determining an average of the multiple lengths of time;
determining a mean of the multiple lengths of time;
filtering highest values from the multiple lengths of time; or
filtering lowest values from the multiple lengths of time;
based on the overall value, determining an input voltage range that corresponds to the overall value; and
using the input voltage to cause the AC system to take an action.

10. The system as recited in claim 9, wherein the at least one length of time includes the measured multiple lengths of time.

11. The system as recited in claim 9, wherein determining the input voltage comprises:
if the value is within a first threshold range, determining that the input voltage is approximately 120 VAC;
if the value is within a second threshold range, determining that the input voltage is approximately 277 VAC; and
if the value is within a third threshold range, determining that the input voltage is approximately 347 VAC.

12. The system as recited in claim 11,
wherein the first threshold range is from 8.78 msec to 8.88 msec,
wherein the second threshold range is from 8.66 msec to 8.74 msec, and
wherein the third threshold range is from 8.58 msec to 8.63 msec.

13. The system as recited in claim 9, wherein the controller is coupled to the ZCD circuit.

14. The system as recited in claim 9, wherein the controller is further configured to:
if no input voltage range corresponds to the overall value, determine if the overall value is greater than an overall value threshold.

15. The system as recited in claim 14, wherein the controller is further configured to:
if the overall value is greater than the threshold, generate an error value.

16. The system as recited in claim 15, wherein the controller is further configured to:
if the error value is greater than an error value threshold, interrupt delivery of power to a load.

* * * * *